(12) United States Patent
Hsu

(10) Patent No.: US 9,356,239 B2
(45) Date of Patent: May 31, 2016

(54) METHOD FOR MANUFACTURING HIGH RESOLUTION AMOLED BACKPLANE

(71) Applicant: Shenzhen China Star Optoelectronics Technology Co., Ltd., Shenzhen, Guangdong (CN)

(72) Inventor: Yuanjun Hsu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 22 days.

(21) Appl. No.: 14/390,026

(22) PCT Filed: Aug. 21, 2014

(86) PCT No.: PCT/CN2014/084870
§ 371 (c)(1),
(2) Date: Oct. 1, 2014

(87) PCT Pub. No.: WO2016/019602
PCT Pub. Date: Feb. 11, 2016

(65) Prior Publication Data
US 2016/0043351 A1 Feb. 11, 2016

(30) Foreign Application Priority Data
Aug. 7, 2014 (CN) .......................... 2014 1 0387118

(51) Int. Cl.
*H01L 51/00* (2006.01)
*H01L 51/56* (2006.01)
*H01L 27/32* (2006.01)

(52) U.S. Cl.
CPC .......... *H01L 51/002* (2013.01); *H01L 27/3262* (2013.01); *H01L 51/56* (2013.01); *H01L 51/0018* (2013.01); *H01L 2227/323* (2013.01)

(58) Field of Classification Search
None
See application file for complete search history.

(56) References Cited

U.S. PATENT DOCUMENTS

2008/0079005 A1* 4/2008 Tseng ................. H01L 27/1255 257/72
2014/0361276 A1* 12/2014 Hsu ......................... H01L 51/56 257/40

* cited by examiner

*Primary Examiner* — Charles Garber
*Assistant Examiner* — Brigitte Paterson
(74) *Attorney, Agent, or Firm* — Andrew C. Cheng

(57) ABSTRACT

The present invention relates to a method for manufacturing a high resolution AMOLED backplane. The method includes: step 10: forming a first buffer layer on a substrate; step 20: forming a low temperature poly-silicon layer on the first buffer layer; step 30: patternizing the low temperature poly-silicon layer; step 40: forming a gate insulation layer, arranging a proper photoresist mask on the gate insulation layer to correspond to TFT source/drain areas and a storage capacitor area, and subjecting the patternized low temperature poly-silicon layer to a first P+ ion doping operation; step 50: forming a gate terminal and subjecting the patternized low temperature poly-silicon layer to a second P+ ion doping operation by using the gate terminal as a hard mask; and step 60: forming a first insulation layer on the gate terminal and forming source/drain terminals on the first insulation layer so that the source/drain terminals are in contact with portions of the TFT source/drain areas that are subjected to both the first P+ ion doping operation and the second P+ ion doping operation through a contact window. The method for manufacturing a high resolution AMOLED backplane of the present invention improves the design rules so as to increase panel resolution and reduce the contact resistance of source/drain terminals and P+ doping zones.

10 Claims, 3 Drawing Sheets

METHOD FOR MANUFACTURING HIGH RESOLUTION AMOLED BACKPLANE

BACKGROUND OF THE INVENTION

1. Field of the Invention

The present invention relates to the field of displaying, and in particular to a method for manufacturing a high resolution AMOLED (Active Matrix Organic Light Emitting Diode) backplane.

2. The Related Arts

Compared to a TFT-LCD (Thin-Film Transistor Liquid Crystal Display), which is the current main-stream display technology, an OLED (Organic Light-Emitting Diode) display device has a variety of advantages, such as wide view angle, high brightness, high contrast, low power consumption, and being more compact and lighter and is an attention-attracting spot of current flat panel displaying technology. Driving of the OLED display devices is classified in two types, namely passive matrix (PM) and active matrix (AM). Compared to the passive matrix driving, the active matrix driving possesses advantages, such as large quantity of displayed message, low power consumption, extended device lifespan, and high image contrast.

The conventional active matrix organic light emitting diode (AMOLED) display devices use, primarily, low temperature poly-silicon thin-film transistors (LTPS-TFTs) to drive the OLED to give off light. Generally, an AMOLED display device essentially comprises a switch TFT, a driving TFT, a storage capacitor (Cst), and an OLED. In a regular AMOLED display device, the storage capacitor stores a data signal that is switched by the switch TFT and, in response to the data signal stored therein, drives the driving TFT so as to uses an output current that corresponds to the data signal to make the OLED emitting light.

As shown in FIG. 1, a schematic view is given to illustrate a structure of a low temperature poly-silicon array (LTPS-array) of a conventional AMOLED backplane. A manufacturing process of the AMOLED backplane is as follows: depositing a first buffer layer 101 and a second buffer layer 102 on a substrate 100, wherein the first buffer layer 101 can be SiNx and the second buffer layer 102 can be SiOx; depositing an amorphous silicon (a-Si) layer on the second buffer layer 102, followed by a high-temperature dehydrogenation process to remove the hydrogen content of the a-Si layer and a low-temperature poly-silicon process to convert the a-Si layer into a low temperature poly-silicone (Poly-Si) layer, and patternizing of the low temperature poly-silicon layer to form a patternized low temperature poly-silicon layer 10; subjecting the patternized low temperature poly-silicon layer 110 to a P+ ion doping process by injecting P+ ions; depositing a gate insulation (GI) layer 111 on the patternized low temperature poly-silicon layer 110; depositing a gate terminal metal layer on the gate insulation layer 111 and applying a masking operation to the gate terminal metal layer for exposure, followed by development and etching operations to form a gate terminal 120; depositing a first insulation layer 121 and a second insulation layer 122 on the gate terminal 120, and using contact windows to make source/drain terminals 130 by, followed by formations of a planarization layer (PL) 140, an electrode layer 150, a bank 160, and spacers (PS) 170.

Patternization of the poly-silicon layer or other layers is achieved with a yellow light process, of which a specific way of performance is: covering a layer of photo-sensitive material on the poly-silicon layer, the layer being referred to as a photoresist layer, and then allowing light to pass through a mask to irradiate the photoresist to cause exposure of the photoresist. Since the mask carries a pattern of the poly-silicon layer, a portion of the light is allowed to pass through the mask to irradiate the photoresist layer, whereby the exposure of photoresist layer is done in a selective way, and it helps to completely duplicate the pattern of the mask on the photoresist. Then, a proper developer is applied to remove a portion of the photoresist so as to have the photoresist layer presenting a desired pattern. Then, an etching operation is applied to remove residual poly-silicon layer, wherein the etching operation can be selected from wet etching, dry etching, and a combination thereof. Finally, the remaining patternized photoresist layer is completely removed to complete the patternization process of the poly-silicon layer.

In FIG. 1, as well as other drawings of the present invention, the texts of "switch TFT", "driving TFT", and "storage capacitor" respectively and generally indicate the locations of the corresponding structure of the switch TFT, driving TFT, and storage capacitor in the drawings. The patternized poly-silicon layer 110 formed through patternization of the low temperature poly-silicon layer generally comprises a storage capacitor area 1, TFT source/drain areas and channels 2, 3. The storage capacitor area 1 is provided for the formation of a storage capacitor. The TFT source/drain area and channel 2 is provided for the formation of the source/drain terminals and the channel of a switch TFT. The TFT source/drain area and channel 3 is provided for the formation of the source/drain terminals and the channel of a driving TFT. As shown in FIG. 1, in the prior art technology, the buffer layers and the amorphous silicon layer are deposited first and then the amorphous silicon is subjected laser-driving crystallization to become a low temperature poly-silicon layer, followed by patternization through yellow light and etching operations. The low temperature poly-silicon layer is subjected to a doping operation. The other layers are respectively formed through deposition/yellow light/etching operations. Since a storage capacitor is to be formed, doping of P+ must be done before the gate terminal 120 is formed. In order to avoid shifting of yellow light, the switch TFT and the driving TFT are made as gate overlap TFTs with a single-side overlapping length L being at least 1.25 micrometers. Due to the necessity of increasing the width of the gate terminal, the light transmittance of the panel is influenced, making it disadvantageous for increasing the resolution of the panel.

SUMMARY OF THE INVENTION

Thus, an object of the present invention is to provide a method for manufacturing a high resolution AMOLED backplane, which helps increase the panel resolution.

To achieve the object, the present invention provides a method for manufacturing a high resolution active matrix organic light emitting diode (AMOLED) backplane, comprising:

Step 10: forming a first buffer layer on a substrate;

Step 20: forming a low temperature poly-silicon layer on the first buffer layer;

Step 30: patternizing the low temperature poly-silicon layer to form a patternized low temperature poly-silicon layer that include a storage capacitor area and TFT source/drain areas and channel areas;

Step 40: forming a gate insulation layer on the patternized low temperature poly-silicon layer, arranging a proper photoresist mask on the gate insulation layer to correspond to the TFT source/drain areas and the storage capacitor area, and subjecting the patternized low temperature poly-silicon layer to a first P+ ion doping operation;

Step 50: forming a gate metal layer on the gate insulation layer, patternizing the gate metal layer to form a gate terminal, subjecting the patternized low temperature poly-silicon layer to a second P+ ion doping operation by using the gate terminal as a hard mask; and Step 60: forming a first insulation layer on the gate terminal, forming source/drain terminals on the first insulation layer, wherein the source/drain terminals are in contact with portions of the TFT source/drain areas that are subjected to both the first P+ ion doping operation and the second P+ ion doping operation through a contact window.

Wherein, the second P+ ion doping operation implant P+ ions in the patternized low temperature poly-silicon layer to a depth greater than that of the first P+ ion doping operation.

Wherein, further comprising forming a second buffer layer between the first buffer layer and the low temperature poly-silicon layer.

Wherein, further comprising forming a second insulation layer between the first insulation layer and the source/drain terminals.

Wherein, further comprising forming a planarization layer on the source/drain terminals Wherein, further comprising forming an electrode layer on the planarization layer.

Wherein, further comprising forming an organic layer on the electrode layer.

Wherein, further comprising forming spacers on the organic layer.

Wherein, the gate terminal comprises molybdenum.

The present invention also provides a method for manufacturing a high resolution active matrix organic light emitting diode (AMOLED) backplane, comprising:

Step 10: forming a first buffer layer on a substrate;

Step 20: forming a low temperature poly-silicon layer on the first buffer layer;

Step 30: patternizing the low temperature poly-silicon layer to form a patternized low temperature poly-silicon layer that include a storage capacitor area and TFT source/drain areas and channel areas;

Step 40: forming a gate insulation layer on the patternized low temperature poly-silicon layer, arranging a proper photoresist mask on the gate insulation layer to correspond to the TFT source/drain areas and the storage capacitor area, and subjecting the patternized low temperature poly-silicon layer to a first P+ ion doping operation;

Step 50: forming a gate metal layer on the gate insulation layer, patternizing the gate metal layer to form a gate terminal, subjecting the patternized low temperature poly-silicon layer to a second P+ ion doping operation by using the gate terminal as a hard mask; and Step 60: forming a first insulation layer on the gate terminal, forming source/drain terminals on the first insulation layer, wherein the source/drain terminals are in contact with portions of the TFT source/drain areas that are subjected to both the first P+ ion doping operation and the second P+ ion doping operation through a contact window;

wherein the second P+ ion doping operation implant P+ ions in the patternized low temperature poly-silicon layer to a depth greater than that of the first P+ ion doping operation;

the method for manufacturing a high resolution AMOLED backplane further comprising forming a second buffer layer between the first buffer layer and the low temperature poly-silicon layer;

the method for manufacturing a high resolution AMOLED backplane further comprising forming a second insulation layer between the first insulation layer and the source/drain terminals;

the method for manufacturing a high resolution AMOLED backplane further comprising forming a planarization layer on the source/drain terminals;

the method for manufacturing a high resolution AMOLED backplane further comprising forming an electrode layer on the planarization layer;

the method for manufacturing a high resolution AMOLED backplane further comprising forming an organic layer on the electrode layer;

the method for manufacturing a high resolution AMOLED backplane further comprising forming spacers on the organic layer; and wherein the gate terminal comprises molybdenum.

In summary, the present invention provides a method for manufacturing a high resolution AMOLED backplane, which applies two P+ doping operations to improve the design rules so as to increase panel resolution and reduce the contact resistance of source/drain terminals and P+ doping zones.

BRIEF DESCRIPTION OF THE DRAWINGS

The technical solution, as well as other beneficial advantages, of the present invention will be apparent from the following detailed description of an embodiment of the present invention, with reference to the attached drawings. In the drawings.

DETAILED DESCRIPTION OF THE PREFERRED EMBODIMENTS

Figure 6:
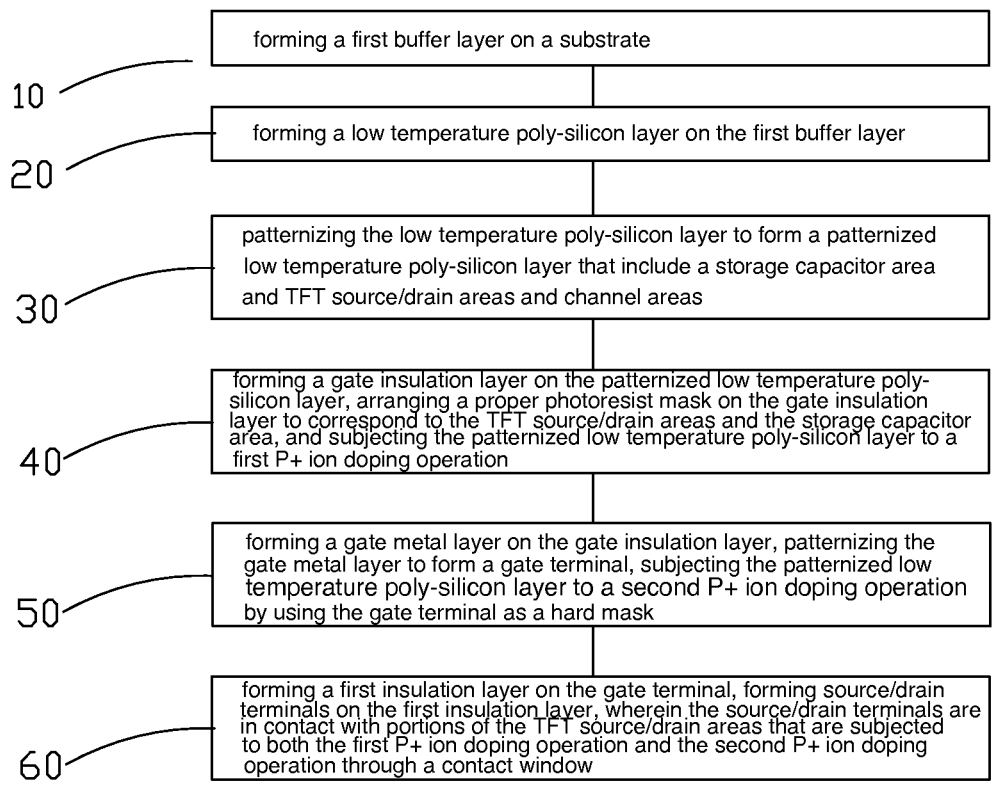
FIG. 6 is a flow chart illustrating the method for manufacturing a high resolution AMOLED backplane according to the preferred embodiment of the present invention.

Referring to FIG. 6, a flow chart is given to illustrate a method for manufacturing a high resolution AMOLED (Active Matrix Organic Light Emitting Diode) backplane according to a preferred embodiment of the present invention. The method generally comprises:

Step 10: forming a first buffer layer on a substrate;

Step 20: forming a low temperature poly-silicon layer on the first buffer layer;

Step 30: patternizing the low temperature poly-silicon layer to form a patternized low temperature poly-silicon layer that include a storage capacitor area and TFT source/drain areas and channel areas;

Step 40: forming a gate insulation layer on the patternized low temperature poly-silicon layer, arranging a proper photoresist mask on the gate insulation layer to correspond to the TFT source/drain areas and the storage capacitor area, and subjecting the patternized low temperature poly-silicon layer to a first P+ ion doping operation;

Step 50: forming a gate metal layer on the gate insulation layer, patternizing the gate metal layer to form a gate terminal, subjecting the patternized low temperature poly-silicon layer to a second P+ ion doping operation by using the gate terminal as a hard mask; and Step 60: forming a first insulation layer on the gate terminal, forming source/drain terminals on the first insulation layer, wherein the source/drain terminals are in contact with portions of the TFT source/drain areas that are subjected to both the first P+ ion doping operation and the second P+ ion doping operation through a contact window.

Figure 1:
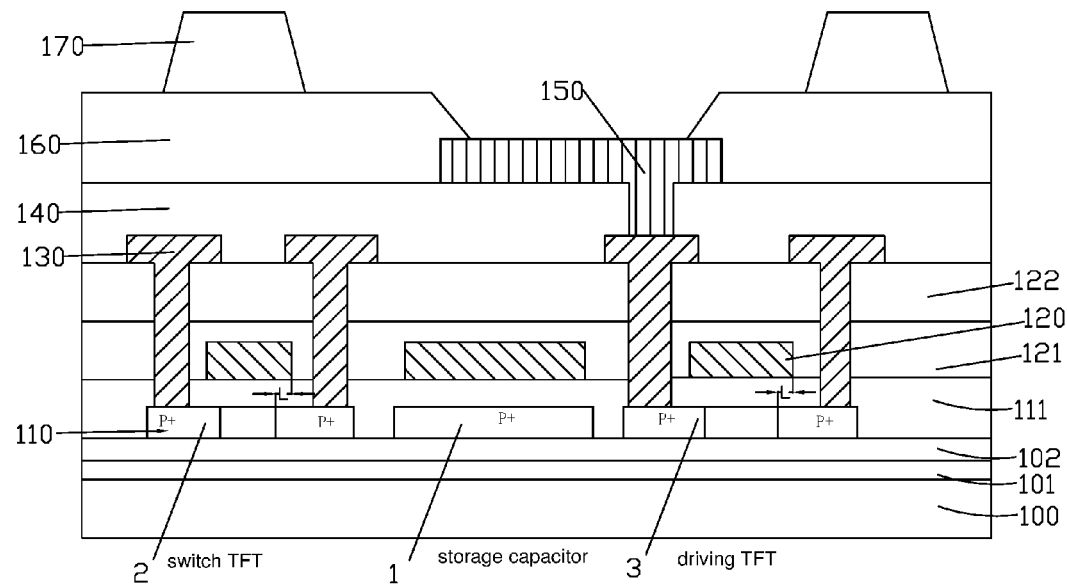
FIG. 1 is a schematic view showing the structure of a conventional low temperature poly-silicon array of an AMOLED backplane.
Figure 2:
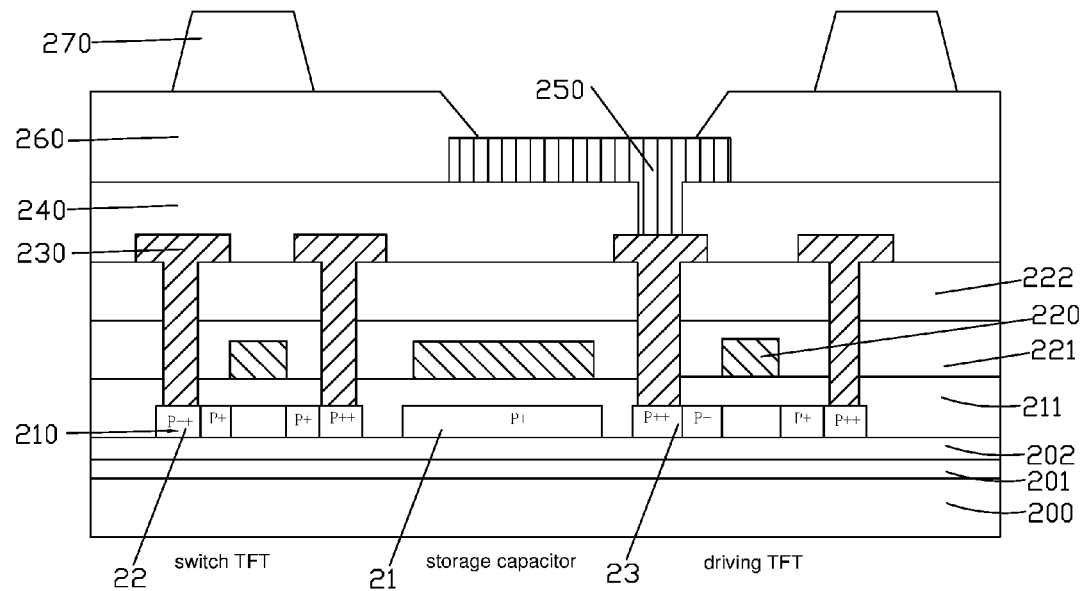
FIG. 2 is a schematic view showing the structure of an AMOLED backplane manufactured with a method for manufacturing a high resolution AMOLED backplane according to a preferred embodiment of the present invention.

The method can be performed in combination with an existing AMOLED backplane manufacturing method and the difference from the existing AMOLED backplane manufacturing method is that two P+ ion doping operations are used so that there is no need to increase the width of the gate terminal as shown in FIG. 1 due to a concern about shifting error among different layers in a yellow light process, whereby light transmittance can be improved and panel resolution can be heightened through the improvement of the design rule.

Figure 3:
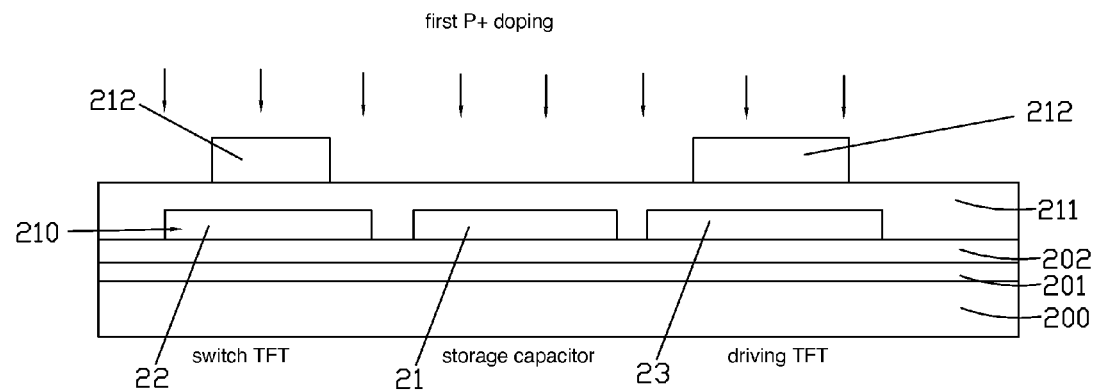
FIGS. 3-5 are schematic views illustrating a doping process of the method for manufacturing a high resolution AMOLED backplane according to the preferred embodiment of the present invention.
Figure 4:
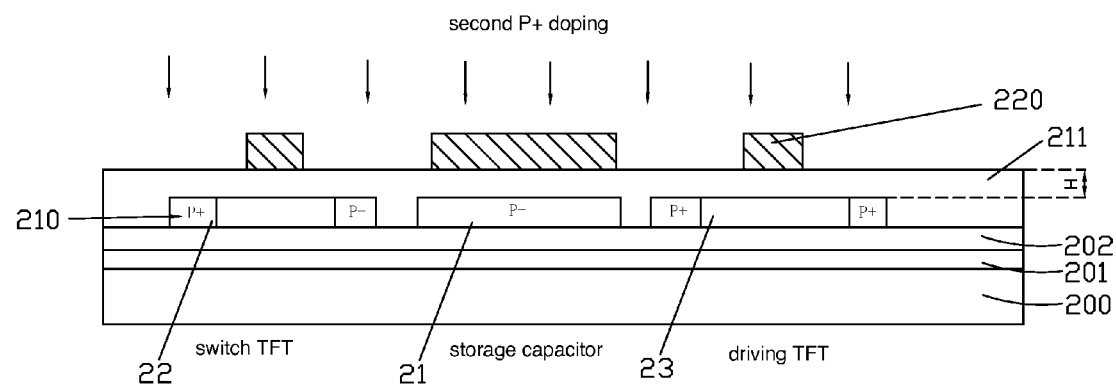
Figure 5:
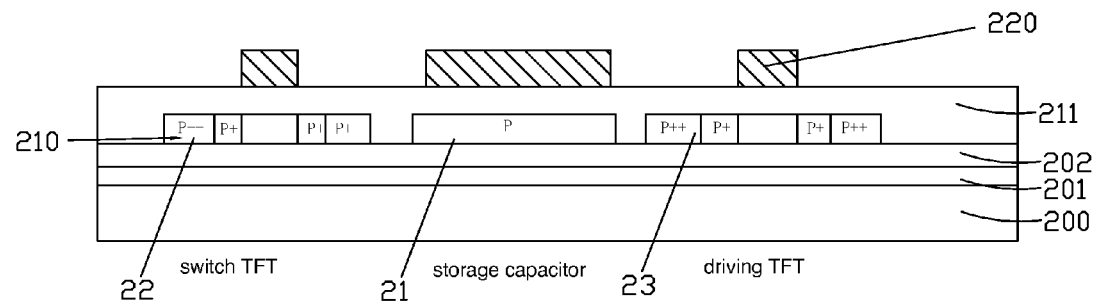

Referring to FIGS. 2 and 3-5, FIG. 2 is a schematic view showing the structure of an AMOLED backplane manufactured with the method for manufacturing a high resolution AMOLED backplane according to the preferred embodiment of the present invention and FIGS. 3-5 are schematic views illustrating a doping process of the method for manufacturing a high resolution AMOLED backplane according to the preferred embodiment of the present invention. A manufacturing process of an AMOLED backplane according to the preferred embodiment is as follows:

A first buffer layer 201 and a second buffer layer 202 are deposited on a substrate 200. In the instant embodiment, the substrate 200 is a transparent substrate, which can be a glass substrate or a plastic substrate. The first buffer layer 201 can be SiNx and the second buffer layer 202 can be SiOx. An amorphous silicon (a-Si) layer is deposited on the second buffer layer 202 and then a high temperature dehydrogenation process is applied to remove the hydrogen content of the a-Si layer and a low temperature poly-silicon operation, such as laser crystallization, is applied to covert the a Si layer into a low temperature poly-silicon (Poly-Si) silicon, and then the low temperature poly-silicon layer is patterned to form a patternized low temperature poly-silicon layer 210.

As shown in FIG. 3, a schematic view is given to illustrate a first doping operation according to the preferred embodiment of the present invention. The patternized low temperature poly-silicon layer 210 generally comprises a storage capacitor area 21, TFT source/drain areas and channel areas 22, 23. The storage capacitor area 21 is provided for formation of a storage capacitor. The TFT source/drain area and channel area 22 is provided for formation of source/drain terminals and a channel of a switch TFT. The TFT source/drain area 23 is provided for formation of source/drain terminals and a channel of a driving TFT. A gate insulation layer 211 is formed on the patternized low temperature poly-silicon layer 210. A proper photoresist mask (PR) 212 is arranged on the gate insulation layer 211 to correspond to the TFT source/drain areas 22, 23 and the storage capacitor area 21 and a first P+ ion doping operation is applied to the patternized low temperature poly-silicon layer 210. In the first doping, the portion of the poly-silicon that corresponds to the storage capacitor is not shielded by the photoresist mask so that the portion of the poly-silicon, after the first doping, is increased in respect of the electrical conduction performance, making it possess the electrical conductivity similar to a metal conductor.

As shown in FIGS. 4 and 5, FIG. 4 is a schematic view illustrating a second doping operation according to the preferred embodiment of the present invention and FIG. 5 is a schematic view illustrating the result of the second doping operation. As shown in FIG. 4, after the first doping, P+ zones are formed in the patternized low temperature poly-silicon layer 210. Then, the photoresist mask 212 is removed and a gate metal layer is deposited on the gate insulation layer 211. The gate metal layer is subjected to exposure by applying a masking process, followed by development and etching operations to make a gate terminal 220. The gate terminal 220 may comprise molybdenum. The gate terminal 220 is used as a hard mask so that self-aligning can be achieved for subjecting the patternized low temperature poly-silicon layer to a second P+ ion doping operation. Through controlling energy parameters of an ion injection machine, the first P+ ion doping operation and the second P+ ion doping operation can be carried out to implant P+ ions to different depths of the patternized low temperature poly-silicon layer 210, whereby in the second doping operation, the injection depth achieved with the ion injection machine is higher than that of the first operation. Thus, as shown in FIG. 5, the two ends of the original patternized low temperature poly-silicon layer 210 are respectively provided with a P++ doping section and a P+ doping section. The storage capacitor area is a P+ doping section having a regular concentration. The impurity concentration distribution of the P++ zone is the superposition of Gaussian distributions of two different depths.

It may also possible to deposit a first insulation layer 221 and a second insulation layer 222 on the gate terminal 220. The first insulation layer 221 and the second insulation layer 222 can be SiOx and SiNx. Then, a contact window is used to form, on the second insulation layer 222, source/drain terminals 230 in contact with the ultrahigh concentration P++ zone to reduce the contact resistance of the source/drain terminals 230 and the P+ doping zone. Thus, it is possible to achieve, in a rear stage of an OLED manufacturing process to connect with a driving TFT to show reduced resistance in controlling brightness and darkness of the OLED. The source/drain terminals 230 can be Ti/Al/Ti, which is a stacked structure formed through sputtering to effectively reduce electrical resistivity, greatly increase the TFT response speed, and help heighten the resolution of a flat panel display device and expand the display size.

Then, a planarization layer 240 can be formed on the source/drain terminals 230. An electrode layer 250 is formed on the planarization layer 240. An organic photoresist layer 260 is formed on the electrode layer 250, and spacers 270 are formed on the organic photoresist layer 260. The electrode layer 250 can be a stacked structure of ITO/Ag/ITO to effectively increase reflectivity and heighten the brightness of the OLED display device. In summary, the present invention provides a method for manufacturing a high resolution AMOLED backplane, which applies two P+ doping operations to improve the design rules so as to increase panel resolution and reduce the contact resistance of source/drain terminals and P+ doping zones.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing a high resolution active matrix organic light emitting diode (AMOLED) backplane, comprising:
   Step 10: forming a first buffer layer on a substrate;
   Step 20: forming a low temperature poly-silicon layer on the first buffer layer;
   Step 30: patternizing the low temperature poly-silicon layer to form a patternized low temperature poly-silicon layer that include a storage capacitor area and TFT source/drain areas and channel areas;

Step 40: forming a gate insulation layer on the patternized low temperature poly-silicon layer, arranging a proper photoresist mask on the gate insulation layer to correspond to the TFT source/drain areas and the storage capacitor area, and subjecting the patternized low temperature poly-silicon layer to a first P+ ion doping operation through the proper photoresist mask to form a first concentration doped portion at each of TFT source/drain areas and the storage capacitor area;

Step 50: forming a gate metal layer on the gate insulation layer, patternizing the gate metal layer to form a gate terminal, subjecting the first concentration doped portions of the TFT source/drain areas of the patternized low temperature poly-silicon layer to a second P+ ion doping operation by using the gate terminal as a hard mask so as to form a second, higher concentration doped portion in a portion of each of the first concentration doped portions of the TFT source/drain areas, wherein the second concentration portions are subjected to both the first and second P+ ion doping operations; and Step 60: forming a first insulation layer on the gate terminal, forming source/drain terminals on the first insulation layer, wherein the source/drain terminals are in contact with the second concentration doped portions of the TFT source/drain areas through a contact window.

2. The method for manufacturing a high resolution AMOLED backplane as claimed in claim 1, wherein the second P+ ion doping operation implant P+ ions in the patternized low temperature poly-silicon layer to a depth greater than that of the first P+ ion doping operation.

3. The method for manufacturing a high resolution AMOLED backplane as claimed in claim 1 further comprising forming a second buffer layer between the first buffer layer and the low temperature poly-silicon layer.

4. The method for manufacturing a high resolution AMOLED backplane as claimed in claim 1 further comprising forming a second insulation layer between the first insulation layer and the source/drain terminals.

5. The method for manufacturing a high resolution AMOLED backplane as claimed in claim 1 further comprising forming a planarization layer on the source/drain terminals.

6. The method for manufacturing a high resolution AMOLED backplane as claimed in claim 5 further comprising forming an electrode layer on the planarization layer.

7. The method for manufacturing a high resolution AMOLED backplane as claimed in claim 6 further comprising forming an organic layer on the electrode layer.

8. The method for manufacturing a high resolution AMOLED backplane as claimed in claim 7 further comprising forming spacers on the organic layer.

9. The method for manufacturing a high resolution AMOLED backplane as claimed in claim 1, wherein the gate terminal comprises molybdenum.

10. A method for manufacturing a high resolution active matrix organic light emitting diode (AMOLED) backplane, comprising:

Step 10: forming a first buffer layer on a substrate;

Step 20: forming a low temperature poly-silicon layer on the first buffer layer;

Step 30: patternizing the low temperature poly-silicon layer to form a patternized low temperature poly-silicon layer that include a storage capacitor area and TFT source/drain areas and channel areas;

Step 40: forming a gate insulation layer on the patternized low temperature poly-silicon layer, arranging a proper photoresist mask on the gate insulation layer to correspond to the TFT source/drain areas and the storage capacitor area, and subjecting the patternized low temperature poly-silicon layer to a first P+ ion doping operation through the proper photoresist mask to form a first concentration doped portion at each of TFT source/drain areas and the storage capacitor area;

Step 50: forming a gate metal layer on the gate insulation layer, patternizing the gate metal layer to form a gate terminal, subjecting the first concentration doped portions of the TFT source/drain areas of the patternized low temperature poly-silicon layer to a second P+ ion doping operation by using the gate terminal as a hard mask so as to form a second, higher concentration doped portion in a portion of each of the first concentration doped portions of the TFT source/drain areas, wherein the second concentration portions are subjected to both the first and second P+ ion doping operations; and Step 60: forming a first insulation layer on the gate terminal, forming source/drain terminals on the first insulation layer, wherein the source/drain terminals are in contact with the second concentration doped portions of the TFT source/drain areas that are subjected to both the first P+ ion doping operation and the second P+ ion doping operation through a contact window;

wherein the second P+ ion doping operation implant P+ ions in the patternized low temperature poly-silicon layer to a depth greater than the first P+ ion doping operation;

the method for manufacturing a high resolution AMOLED backplane further comprising forming a second buffer layer between the first buffer layer and the low temperature poly-silicon layer;

the method for manufacturing a high resolution AMOLED backplane further comprising forming a second insulation layer between the first insulation layer and the source/drain terminals;

the method for manufacturing a high resolution AMOLED backplane further comprising forming a planarization layer on the source/drain terminals;

the method for manufacturing a high resolution AMOLED backplane further comprising forming an electrode layer on the planarization layer;

the method for manufacturing a high resolution AMOLED backplane further comprising forming an organic layer on the electrode layer;

the method for manufacturing a high resolution AMOLED backplane further comprising forming spacers on the organic layer; and wherein the gate terminal comprises molybdenum.

* * * * *